(12) United States Patent
Jung et al.

(10) Patent No.: US 10,468,466 B2
(45) Date of Patent: Nov. 5, 2019

(54) TOUCH DISPLAY PANEL AND METHOD OF MANUFACTURING THE SAME

(71) Applicant: Samsung Display Co., Ltd., Yongin-si (KR)

(72) Inventors: Yang-Ho Jung, Seoul (KR); Chul-Won Park, Suwon-si (KR); Jeong-Min Park, Seoul (KR); Beung-Hwa Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 160 days.

(21) Appl. No.: 15/444,674

(22) Filed: Feb. 28, 2017

(65) Prior Publication Data

US 2017/0256593 A1    Sep. 7, 2017

(30) Foreign Application Priority Data

Mar. 3, 2016    (KR) .......................... 10-2016-0025435

(51) Int. Cl.
*G06F 3/041*    (2006.01)
*H01L 27/32*    (2006.01)

(52) U.S. Cl.
CPC ............ *H01L 27/323* (2013.01); *G06F 3/041* (2013.01); *H01L 27/3246* (2013.01); *G06F 2203/04103* (2013.01); *G06F 2203/04111* (2013.01); *H01L 2227/323* (2013.01)

(58) Field of Classification Search
CPC .... H01L 27/323; H01L 27/3246; G06F 3/041
USPC ................................................. 345/156–204
See application file for complete search history.

(56) References Cited

U.S. PATENT DOCUMENTS

| 2004/0263706 | A1* | 12/2004 | Cho ................... G02F 1/136286 349/43 |
| 2004/0263708 | A1* | 12/2004 | Cho ................... G02F 1/136286 349/43 |
| 2007/0178796 | A1* | 8/2007 | Kwak ................. H01L 27/3276 445/24 |
| 2012/0168796 | A1* | 7/2012 | Moon ................... H01L 27/322 257/98 |
| 2016/0240560 | A1* | 8/2016 | Lin ....................... G06F 3/0412 |
| 2017/0069667 | A1* | 3/2017 | Chen .................... H01L 27/1443 |
| 2017/0077192 | A1* | 3/2017 | Jang ..................... H01L 27/1237 |

FOREIGN PATENT DOCUMENTS

KR    10-2015-0072492    6/2015

\* cited by examiner

*Primary Examiner* — Carolyn R Edwards
(74) *Attorney, Agent, or Firm* — H.C. Park & Associates, PLC

(57) ABSTRACT

A touch display panel including a thin-film transistor substrate including a thin-film transistor, a pixel defining layer disposed on the thin-film transistor substrate and including a first opening, a light emitting structure disposed in the first opening, a thin film encapsulation layer covering the light emitting structure and the pixel defining layer, a first metal pattern disposed on the thin film encapsulation layer, a first insulation pattern disposed on the first metal pattern and having the same shape as the first metal pattern in a plan view, a second metal pattern disposed on the first insulation pattern, and a second insulation layer disposed on the second metal pattern and the thin film encapsulation layer and covering the first metal pattern, the first insulation pattern and the second metal pattern.

9 Claims, 16 Drawing Sheets

TOUCH DISPLAY PANEL AND METHOD OF MANUFACTURING THE SAME

CROSS-REFERENCE TO RELATED APPLICATION

This application claims priority from and the benefit of Korean Patent Application No. 10-2016-0025435, filed on Mar. 3, 2016, which is hereby incorporated by reference for all purposes as if fully set forth herein.

BACKGROUND

Field

Exemplary embodiments relate to a touch display panel, and a method of manufacturing the touch display panel. More particularly, exemplary embodiments relate to a touch display panel having a metal mesh structure, and a method of manufacturing the touch display panel.

Discussion of the Background

A mobile device, such as a smart-phone, may generally include a touch panel sensor. The touch panel sensor may be classified into a capacitive touch panel sensor, a resistive touch panel sensor, a light sensing touch panel sensor, and etc. Recently, the capacitive touch panel sensor that detects a change in capacitance caused by a touch of an external electric conductor, such as a finger, is widely used as the touch panel sensor.

Generally, a touch display panel includes a touch panel that may be formed on a display panel displaying an image. However, the process of forming the touch display panel may be complicated and have low productivity.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a touch display panel capable of improving productivity.

Exemplary embodiments also provide a method of manufacturing the touch display panel.

Additional aspects will be set forth in the detailed description which follows, and, in part, will be apparent from the disclosure, or may be learned by practice of the inventive concept.

According to an exemplary embodiment, a touch display panel includes a thin-film transistor substrate including a thin-film transistor, a pixel defining layer disposed on the thin-film transistor substrate and including a first opening, a light emitting structure disposed in the first opening, a thin film encapsulation layer covering the light emitting structure and the pixel defining layer, a first metal pattern disposed on the thin film encapsulation layer, a first insulation pattern disposed on the first metal pattern and having the same shape as the first metal pattern in a plan view, a second metal pattern disposed on the first insulation pattern, and a second insulation layer disposed on the second metal pattern and the thin film encapsulation layer and covering the first metal pattern, the first insulation pattern and the second metal pattern.

The first metal pattern may overlap the pixel defining layer.

The second metal pattern may overlap the pixel defining layer.

A first contact hole may be formed through the first insulation pattern and the second metal pattern may be electrically connected to the first metal pattern through the first contact hole.

The second insulation layer may include a second opening overlapping the light emitting structure.

The first insulation pattern and the second insulation layer may include an inorganic insulation material.

The first insulation pattern and the second insulation layer may include an organic insulation material.

The touch display panel may include a touch area and a peripheral area adjacent to the touch area, and a contacting pad disposed in the peripheral area. The second insulation layer may include a second contact hole exposing a portion of the contacting pad. The first and second metal pattern may be disposed in the touch area.

The touch display panel may further include a buffer pattern disposed on the thin film encapsulation layer, in which the first metal pattern may be disposed on the buffer pattern and have the same shape same as the buffer pattern in a plan view.

According to an exemplary embodiment, a method of manufacturing a touch display panel includes providing a thin-film transistor substrate, forming a pixel defining layer including a first opening on the thin-film transistor substrate, forming a light emitting structure in the first opening, forming a thin film encapsulation layer covering the light emitting structure and the pixel defining layer, forming a first metal layer and a first insulation layer on the thin film encapsulation layer, forming a first photoresist pattern comprising a first portion having a first height and a second portion having a second height less than the first height on the first insulation layer, forming a first metal pattern and a first insulation pattern by patterning the first metal layer and the first insulation layer using the first photoresist pattern, and forming a second metal pattern on the thin film encapsulation layer on which the first insulation pattern is formed.

Forming the first metal pattern and the first insulation pattern may include patterning the first metal layer and the first insulation layer may using the first photoresist pattern as an etch barrier, such that the first metal pattern and the first insulation pattern have the same shape in a plan view.

Forming the first metal pattern and the first insulation pattern may further include removing a portion of the first photoresist pattern such that the second portion is removed while a portion of the first portion is remained, after forming the first metal pattern and the first insulation pattern, and etching the first insulation layer using the remaining portion of the first photoresist pattern as a mask, such that a first contact hole exposing the first metal pattern is formed.

The method may further include forming a second insulation layer on the second metal pattern.

The touch display panel may include a touch area and a peripheral area adjacent to the touch area, and a contacting pad disposed in the peripheral area. The second insulation layer may include a second contact hole exposing the contacting pad. The first and second metal patterns may be disposed in the touch area.

The first insulation pattern and the second insulation layer may include an inorganic insulation material.

The method may further include forming a second opening through the second insulation layer to overlap the light emitting structure.

The first insulation pattern and the second insulation layer may include an organic insulation material.

Forming the second insulation layer may include forming a photoresist layer on a second metal layer forming the second metal pattern, and exposing and developing the photoresist layer, such that a second opening that overlaps the light emitting structure is formed in the second insulation layer.

The method may further include forming a buffer layer on the thin film encapsulation layer before forming the first metal layer, in which forming the first metal pattern and the first insulation pattern includes patterning the buffer layer, the first metal layer, and the first insulation layer to form a buffer pattern, the first metal pattern, and the first insulation pattern may be formed.

The first and second metal patterns may overlap the pixel defining layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
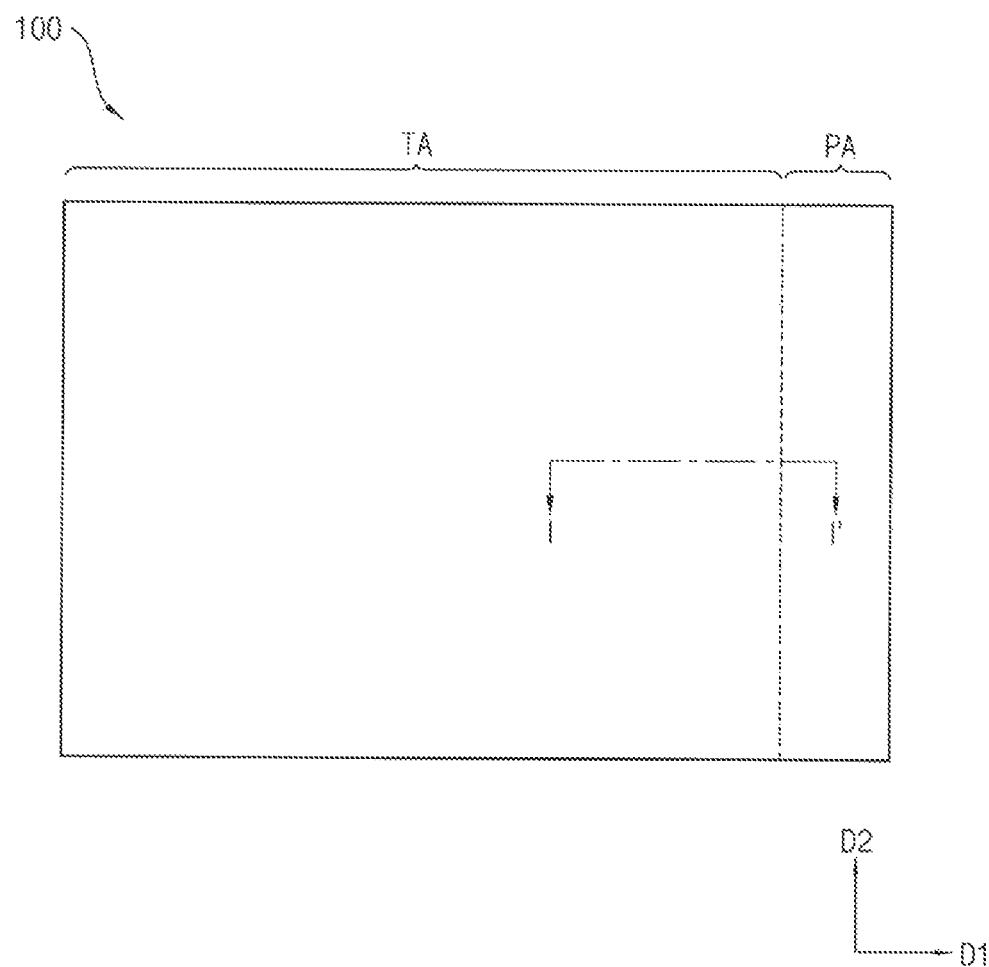
FIG. 1 is a plan view illustrating a touch display panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
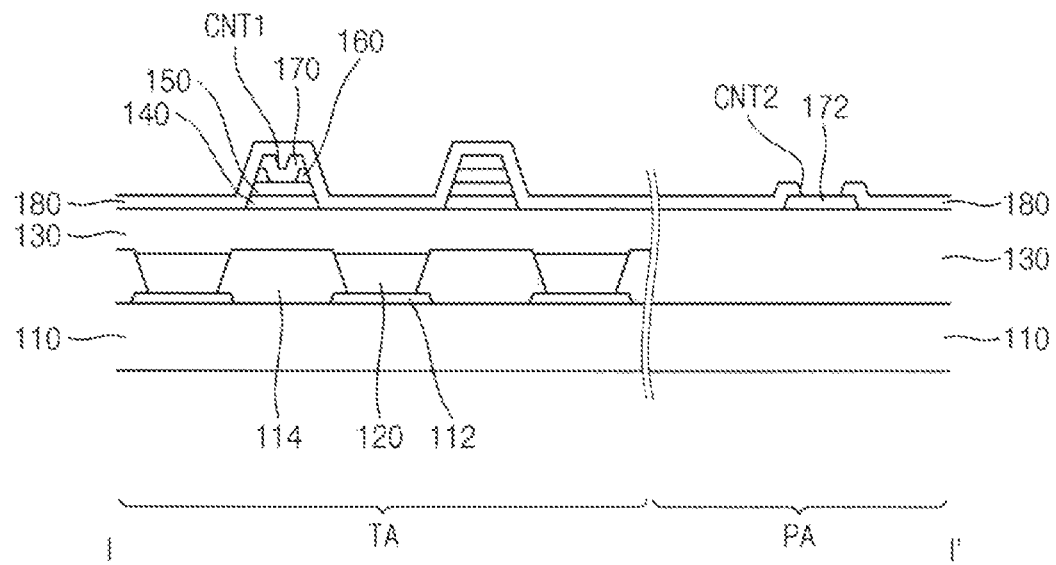
FIG. 2 is a cross-sectional view taken along a line I-I' of FIG. 1.

FIG. 1 is a plan view illustrating a touch display panel according to an exemplary embodiment. FIG. 2 is a cross-sectional view taken along a line I-I' of FIG. 1.

Referring to FIGS. 1 and 2, a touch display panel 100 may include a thin-film transistor substrate 110, a pixel electrode 112, a pixel defining layer 114, a light emitting structure 120, a thin film encapsulation layer 130, a buffer pattern 140, a first metal pattern 150, a first insulation pattern 160, a second metal pattern 170, a contacting pad 172, and a second insulation layer 180.

The thin-film transistor substrate 110 may be a substrate including thin-film transistors and signal lines for driving pixels to display an image. For example, the thin-film transistor substrate 110 may include a base substrate, the thin-film transistor, the signal line electrically connected to the thin-film transistor, and insulation layers. The thin-film transistor substrate 110 may be a backplane substrate formed by a low temperature poly silicon (LTPS) process.

The pixel electrode 112 may be disposed to correspond to a pixel on the thin-film transistor substrate 110. The pixel electrode 112 may include a reflective material or a transmissive material in accordance with the emission type of the touch display apparatus. For example, the pixel electrode 112 may include aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and etc. These may be used alone or in a combination thereof. The pixel electrode 112 may have a single layer structure or a multi-layer structure, which may include a metal film, an alloy film, a metal nitride film, a conductive metal oxide film and/or a transparent conductive film.

The pixel defining layer 114 may be disposed on the thin-film transistor substrate 110 on which the pixel electrode 112 is disposed. The pixel defining layer 114 may include an organic material or an inorganic material. For example, the pixel defining layer 114 may be formed by using photoresist, acryl-based resin, polyacryl-based resin, polyimide-based resin, a silicon compound, and etc. The pixel defining layer 114 may define an opening which exposes a portion of the pixel electrode 112.

The light emitting structure 120 may be disposed on a portion of the pixel electrode 112 exposed by the opening of the pixel defining layer 114. The light emitting structure 120 may be formed by a laser induced thermal imaging process, a printing process, etc. The light emitting structure 120 may include an organic light emitting layer (EL), a hole injection layer (HIL), a hole transfer layer (HTL), an electron transfer layer (ETL), an electron injection layer (EIL), etc. In exemplary embodiments, the organic light emitting layer EL of the light emitting structure 120 may include light emitting materials for generating different colors of light, such as a red color of light (R), a green color of light (G), and a blue color of light (B) in accordance with a position of each pixel in the display apparatus. In some exemplary embodiments, the organic light emitting layer EL of the of the light emitting structure 120 may include a plurality of stacked light emitting materials that generates a red color of light, a green color of light, and a blue color of light, to emit a white color of light.

An opposite electrode (not shown) may be formed on the light emitting structure 120. The opposite electrode may include a transmissive material or a reflective material in accordance with the emission type of the touch display apparatus.

The thin film encapsulation layer 130 may be disposed on the light emitting structure 120 and the pixel defining layer 114. The thin film encapsulation layer 130 may prevent ambient air and moisture from permeating into the transparent organic light emitting display apparatus. The thin film encapsulation layer 130 may include an inorganic film, such as silicon oxide or silicon nitride film, and an organic film, such as epoxy or polyimide film, which are alternately and repeatedly formed. However, exemplary embodiments of the thin film encapsulation layer 130 are not limited thereto, and any transparent thin film for sealing may be utilized. An upper surface of the thin film encapsulation layer 130 may be flat.

The touch display panel 100 may include a touch area TA that may detect a touch position, and a peripheral area PA adjacent to the touch area TA and disposed at an edge of the touch display panel 100. For example, the peripheral area PA is disposed adjacent to the touch area TA in a first direction D1, and extends in a second direction D2 substantially perpendicular to the first direction D1.

The buffer pattern 140 may be disposed on the thin film encapsulation layer 130. The buffer pattern 140 may include an inorganic insulation material. For example, the buffer pattern 140 may include silicon oxide ($SiO_x$), silicon nitride ($SiN_x$), etc. The buffer pattern 140 may be disposed in the touch area TA of the touch display panel 100. Alternatively, the buffer pattern 140 may be omitted and the first metal pattern 150 may be disposed on the thin film encapsulation layer 130.

The first metal pattern 150 may be disposed on the buffer pattern 140. In a plan view, the first metal pattern 150 may have substantially the same shape as the buffer pattern 140. The first metal pattern 150 may be disposed to overlap the pixel defining layer 114. As such, even when the first metal pattern 150 is opaque, light emitting area of the light emitting structure 120 may not be effected. The first metal pattern 150 may have a metal mesh structure. For example, in a plan view, the first metal pattern 150 overlaps the pixel defining layer 114, and forms a grid along an extension direction of the pixel defining layer 114, such that the first metal pattern 150 has the metal mesh structure. The first metal pattern 150 may include metal such as gold (Au), silver (Ag), copper (Cu), nickel (Ni), iron (Fe), cobalt (Co), zinc (Zn), chromium (Cr), manganese (Mn), or combinations thereof.

The first insulation pattern 160 may be disposed on the first metal pattern 150. In a plan view, the first insulation pattern 160 may have substantially same shape as the first metal pattern 150. The first insulation pattern 160 may define a first contact hole CNT1 exposing the first metal pattern 150. The first insulation pattern 160 may include an inorganic insulation material. For example, the first insulation pattern 160 may include silicon oxide ($SiO_x$), silicon nitride ($SiN_x$), and etc.

The second metal pattern 170 may be disposed on the first insulation pattern 160. The second metal pattern 170 may be electrically connected to the first metal pattern 150 through the first contact hole CNT1 of the first insulation pattern 160. The second metal pattern 170 may include metal such as gold (Au), silver (Ag), copper (Cu), nickel (Ni), iron (Fe), cobalt (Co), zinc (Zn), chromium (Cr), manganese (Mn), or combinations thereof.

The contacting pad 172 may be disposed on the thin film encapsulation layer 130. The contacting pad 172 may be disposed in the peripheral area PA. The contacting pad 172 may be electrically connected to the first and second metal patterns 150 and 170, and electrically connected to an additional driving circuit (not shown) to drive the touch display panel 100. In addition, the contacting pad 172 may be electrically connected to an electric circuit of the thin-film transistor substrate 110 through a contact hole (not shown) formed through the thin film encapsulation layer 130. The contacting pad 172 may be formed from the same layer as the second metal pattern 170. Thus, the contacting pad 172 may include the same material as the second metal pattern 170.

The second insulation layer 180 may be disposed on the thin film encapsulation layer 130, on which the second metal pattern 170 and the contacting pad 172 are disposed. The second insulation layer 180 may cover both the first metal pattern 150 and the second metal pattern 170 in the touch area TA. The second insulation layer 180 may define a second contact hole CNT2 which exposes the contacting pad 172 in the peripheral area PA. The driving circuit may be electrically connected to a touch circuit of the touch display panel 100 through the second contact hole CNT2. The second insulation layer 180 may include an inorganic insulation material. For example, the second insulation layer 180 may include silicon oxide ($SiO_x$), silicon nitride ($SiN_x$), and etc.

The first metal pattern 150 and the second metal pattern 170 may be connected or disconnected to each other at appropriate positions to constitute a touch circuit, which may include touch electrodes, a driving line, and a sensing line for touch position sensing.

According to an exemplary embodiment, the touch display panel 100 includes the buffer pattern 140, the first metal pattern 150, and the first insulation pattern 160, which have the same shape in a plan view. Thus, the touch display panel 100 has a simple structure as compared to a conventional touch display panel that may include a buffer pattern, a first metal pattern, and a first insulation pattern that are formed from different masks and have different shapes from each other. Accordingly, the touch display panel 100 according to an exemplary embodiment may improve productivity from its simple structure.

Figure 3:
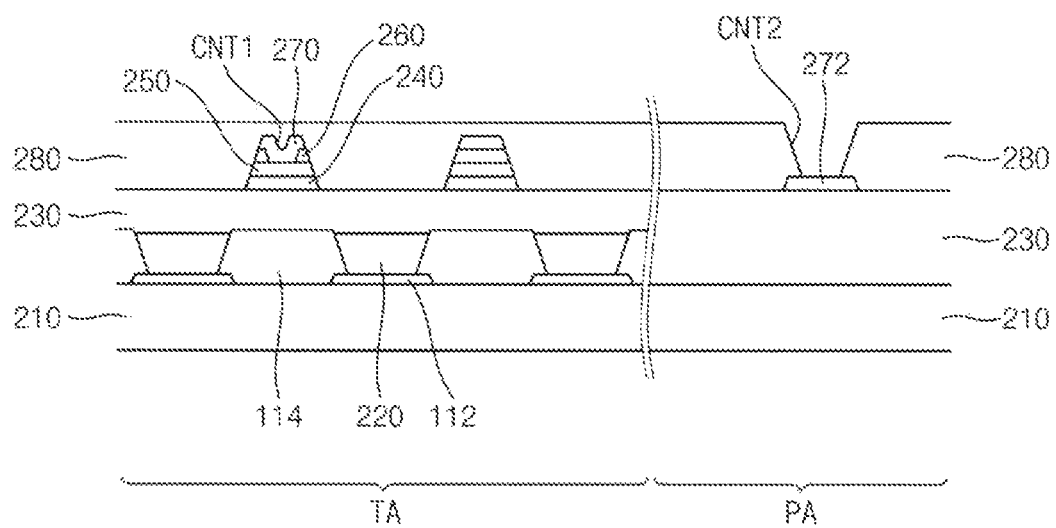
FIG. 3 is a cross-sectional view illustrating a touch display panel according to an exemplary embodiment.

FIG. 3 is a cross-sectional view illustrating a touch display panel according to an exemplary embodiment.

Referring to FIG. 3, the touch display panel is substantially same as the touch display panel of FIGS. 1 and 2, except for a first insulation pattern 260 and a second insulation layer 280. Thus, detailed descriptions with respect to the substantially same elements will be briefly explained or omitted.

The touch display panel may include a thin-film transistor substrate 210, a pixel electrode 212, a pixel defining layer 214, a light emitting structure 220, a thin film encapsulation layer 230, a buffer pattern 240, a first metal pattern 250, a first insulation pattern 260, a second metal pattern 270, a contacting pad 272, and a second insulation layer 280.

The thin-film transistor substrate 210 may be a substrate including thin-film transistors and signal lines for driving pixels to display an image. The pixel electrode 212 may be disposed to correspond to a pixel on the thin-film transistor substrate 210. The pixel defining layer 214 may be disposed on the thin-film transistor substrate 210 on which the pixel electrode 212 is disposed. The light emitting structure 220 may be disposed on a portion of the pixel electrode 212 exposed by an opening of the pixel defining layer 214. The thin film encapsulation layer 230 may be disposed on the light emitting structure 220 and the pixel defining layer 214.

The buffer pattern 240 may be disposed on the thin film encapsulation layer 230. The buffer pattern 240 may include an inorganic insulation material. For example, the buffer pattern 240 may include silicon oxide ($SiO_x$), silicon nitride ($SiN_x$), and etc. The buffer pattern 240 may be disposed in a touch area TA of the touch display panel. Alternatively, the buffer pattern 240 may be omitted and the first metal pattern 250 may be disposed on the thin film encapsulation layer 230.

The touch display panel may include the touch area TA that may detect a touch position, and a peripheral area PA adjacent to the touch area TA and disposed at an edge of the touch display panel.

The first metal pattern 250 may be disposed on the buffer pattern 240. In a plan view, the first metal pattern 250 may have substantially the same shape as the buffer pattern 240. The first metal pattern 250 may be disposed to overlap the pixel defining layer 214. The first metal pattern 250 may have a metal mesh structure. The first metal pattern 250 may include metal such as gold (Au), silver (Ag), copper (Cu), nickel (Ni), iron (Fe), cobalt (Co), zinc (Zn), chromium (Cr), manganese (Mn), or combinations thereof.

The first insulation pattern 260 may be disposed on the first metal pattern 250. In a plan view, the first insulation pattern 260 may have substantially the same shape as the first metal pattern 250. The first insulation pattern 260 may define a first contact hole CNT1 exposing the first metal pattern 250. The first insulation pattern 260 may include an organic insulation material. For example, the first insulation pattern 260 may include photoresist, acryl-based resin, polyimide-based resin, polyamide-based resin, siloxane-based resin, and etc. These may be used alone or in a combination thereof.

The second metal pattern 270 may be disposed on the first insulation pattern 260. The second metal pattern 270 may be electrically connected to the first metal pattern 250 through the first contact hole CNT1 of the first insulation pattern 260. The second metal pattern 170 may include metal such as gold (Au), silver (Ag), copper (Cu), nickel (Ni), iron (Fe), cobalt (Co), zinc (Zn), chromium (Cr), manganese (Mn), or combinations thereof.

The contacting pad 272 may be disposed on the thin film encapsulation layer 230. The contacting pad 272 may be disposed in the peripheral area PA. The contacting pad 272 may be formed from the same layer as the second metal pattern 270. As such, the contacting pad 272 may include the same material as the second metal pattern 270.

The second insulation layer 280 may be disposed on the thin film encapsulation layer 230 on which the second metal pattern 270 and the contacting pad 272 are disposed. The second insulation layer 280 may cover both the first metal pattern 250 and the second metal pattern 270 in the touch area TA. The second insulation layer 280 may define a second contact hole CNT2 which exposes the contacting pad 272 in the peripheral area PA. The second insulation layer 280 may include an organic insulation material. For example, the second insulation layer 280 may include photoresist, acryl-based resin, polyimide-based resin, polyamide-based resin, siloxane-based resin, and etc. These may be used alone or in a combination thereof. An upper surface of the second insulation layer 280 may be flat.

According to an exemplary embodiment illustrated with reference to FIG. 2, the touch display apparatus includes the second insulation layer 280 including the organic insulation material. Thus, when the touch display panel is a flexible touch display panel, a risk of the touch display panel from being broken may be lower than a touch display panel having a second insulation layer including an inorganic insulation material.

Figure 4:
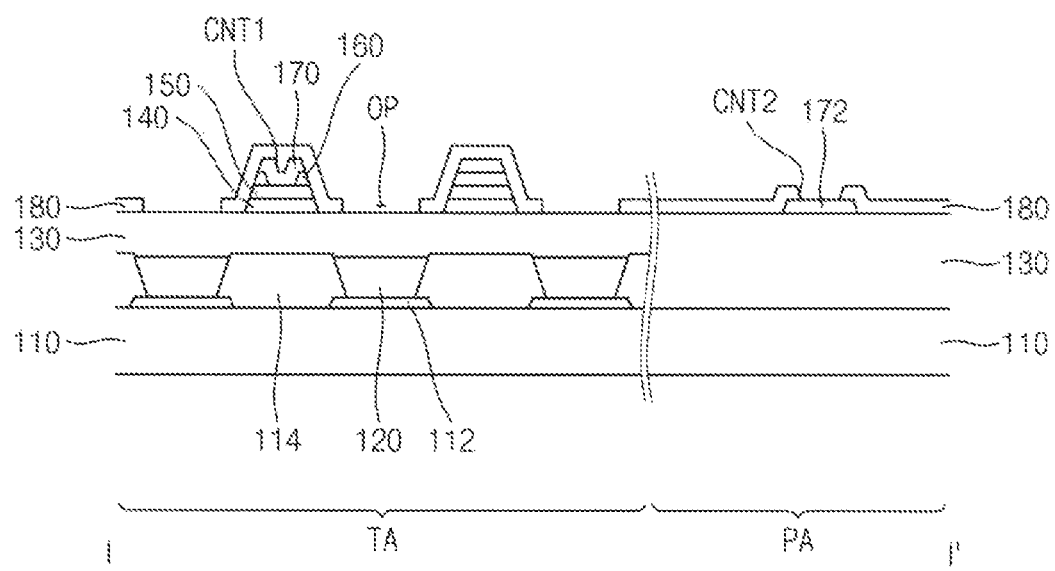
FIG. 4 is a cross-sectional view illustrating a touch display panel according to an exemplary embodiment.

FIG. 4 is a cross-sectional view illustrating a touch display panel according to an exemplary embodiment.

Referring to FIG. 4, the touch display panel is substantially the same as the touch display panel of FIGS. 1 and 2, except for an opening in a second insulation layer 180. Thus, detailed descriptions with respect to the substantially the same elements will be briefly explained or omitted.

The touch display panel may include a thin-film transistor substrate 110, a pixel electrode 112, a pixel defining layer 114, a light emitting structure 120, a thin film encapsulation layer 130, a buffer pattern 140, a first metal pattern 150, a first insulation pattern 160, a second metal pattern 170, a contacting pad 172, and a second insulation layer 180.

The thin-film transistor substrate 110 may be a substrate including thin-film transistors and signal lines for driving pixels to display an image. The pixel electrode 112 may be disposed to correspond to a pixel on the thin-film transistor substrate 110. The pixel defining layer 114 may be disposed on the thin-film transistor substrate 110 on which the pixel electrode 112 is disposed. The light emitting structure 120 may be disposed on a portion of the pixel electrode 112 exposed by an opening of the pixel defining layer 114. An opposite electrode (not shown) may be formed on the light emitting structure 120. The thin film encapsulation layer 130 may be disposed on the light emitting structure 120 and the pixel defining layer 114.

The touch display panel 100 may include a touch area TA that may detect a touch position, and a peripheral area PA adjacent to the touch area TA and disposed at an edge of the touch display panel 100. The buffer pattern 140 may be disposed on the thin film encapsulation layer 130.

The first metal pattern 150 may be disposed on the buffer pattern 140. The first metal pattern 150 may be disposed in the touch area TA. In a plan view, the first metal pattern 150 may have substantially the same shape as the buffer pattern 140.

The first insulation pattern 160 may be disposed on the first metal pattern 150 in the touch area TA. In a plan view, the first insulation pattern 160 may have substantially the same shape as the first metal pattern 150. The first insulation pattern 160 may define a first contact hole CNT1 exposing the first metal pattern 150.

The second metal pattern 170 may be disposed on the first insulation pattern 160 in the touch area TA. The second metal pattern 170 may be electrically connected to the first metal pattern 150 through the first contact hole CNT1 of the first insulation pattern 160.

The contacting pad 172 may be disposed on the thin film encapsulation layer 130 in the peripheral area PA. The contacting pad 172 may be formed from the same layer as the second metal pattern 170. As such, the contacting pad 172 may include the same material as the second metal pattern 170.

The second insulation layer 180 may be disposed on the thin film encapsulation layer 130 on which the second metal pattern 170 and the contacting pad 172 are disposed. The second insulation layer 180 may cover both the first metal pattern 150 and the second metal pattern 170 in the touch area TA. The second insulation layer 180 may define a second contact hole CNT2 which exposes the contacting pad 172 in the peripheral area PA. A driving circuit may be electrically connected to a touch circuit of the touch display panel 100 through the second contact hole CNT2. The second insulation layer 180 may include an inorganic insulation material. For example, the second insulation layer 180 may include silicon oxide ($SiO_x$), silicon nitride ($SiN_x$), and etc.

The second insulation layer 180 may define an opening OP corresponding to the light emitting structure 120. The touch display panel may be a flexible touch display apparatus, and a plurality of the openings OP may be formed through the second insulation layer 180. As such, even when the touch display panel is bent, damage to the second insulation layer 180 may be minimized.

Figure 5:
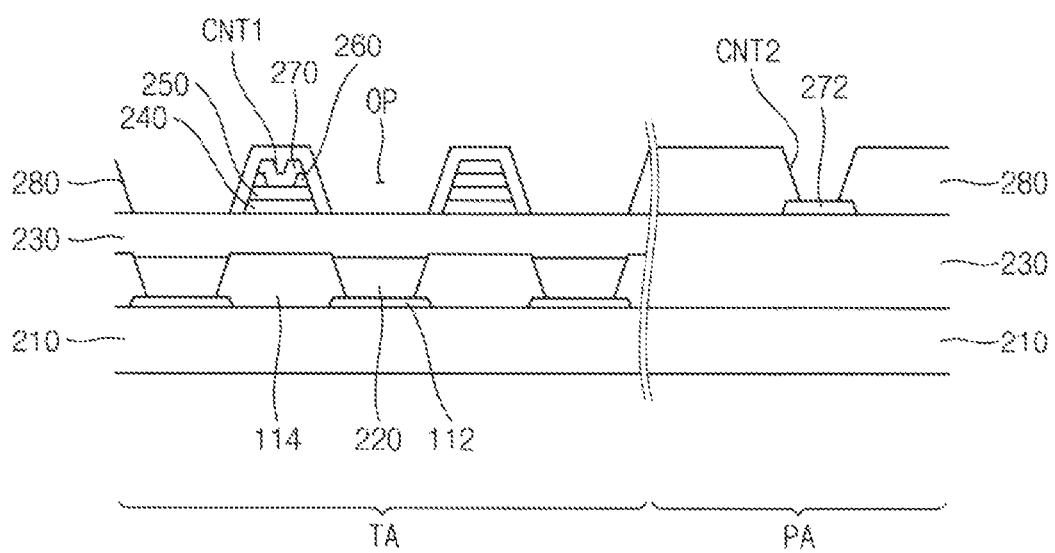
FIG. 5 is a cross-sectional view illustrating a touch display panel according to an exemplary embodiment.

FIG. 5 is a cross-sectional view illustrating a touch display panel according to an exemplary embodiment.

Referring to FIG. 5, the touch display panel is substantially the same as the touch display panel of FIG. 3, except for an opening OP in a second insulation layer 280. Thus, detailed descriptions with respect to substantially the same elements will be briefly explained or omitted.

The touch display panel may include a thin-film transistor substrate 210, a pixel electrode 212, a pixel defining layer 214, a light emitting structure 220, a thin film encapsulation layer 230, a buffer pattern 240, a first metal pattern 250, a first insulation pattern 260, a second metal pattern 270, a contacting pad 272, and a second insulation layer 280.

The thin-film transistor substrate 210 may a substrate including thin-film transistors and signal lines for driving pixels to display an image. The pixel electrode 212 may be disposed to correspond to a pixel on the thin-film transistor substrate 210. The pixel defining layer 214 may be disposed on the thin-film transistor substrate 210 on which the pixel electrode 212 is disposed. The light emitting structure 220 may be disposed on a portion of the pixel electrode 212 exposed by an opening of the pixel defining layer 214. An opposite electrode (not shown) may be formed on the light emitting structure 220. The thin film encapsulation layer 230 may be disposed on the light emitting structure 220 and the pixel defining layer 214.

The touch display panel may include the touch area TA that may detect a touch position, and a peripheral area PA adjacent to the touch area TA and disposed at an edge of the touch display panel. The buffer pattern 240 may be disposed on the thin film encapsulation layer 230 in the touch area TA.

The first metal pattern 250 may be disposed on the buffer pattern 240 in the touch area TA. In a plan view, the first metal pattern 250 may have substantially the same shape as the buffer pattern 240.

The first insulation pattern 260 may be disposed on the first metal pattern 250. In a plan view, the first insulation pattern 260 may have substantially the same shape as the first metal pattern 250. The first insulation pattern 260 may define a first contact hole CNT1 exposing the first metal pattern 250. The first insulation pattern 260 may include an organic insulation material.

The second metal pattern 270 may be disposed on the first insulation pattern 260. The second metal pattern 270 may be electrically connected to the first metal pattern 250 through the first contact hole CNT1 of the first insulation pattern 260.

The contacting pad 272 may be disposed on the thin film encapsulation layer 230. The contacting pad 272 may be disposed in the peripheral area PA. The contacting pad 272 may be formed from the same layer as the second metal pattern 270. As such, the contacting pad 272 may include the same material as the second metal pattern 270.

The second insulation layer 280 may be disposed on the thin film encapsulation layer 230 on which the second metal pattern 270 and the contacting pad 272 are disposed. The second insulation layer 280 may cover both the first metal pattern 250 and the second metal pattern 270 in the touch area TA. The second insulation layer 280 may define a second contact hole CNT2 which exposes the contacting pad 272 in the peripheral area PA. The second insulation layer 280 may include an organic insulation material. An upper surface of the second insulation layer 280 may be flat.

The second insulation layer 280 may define an opening OP corresponding to the light emitting structure 220. The touch display panel may be a flexible touch display apparatus, and a plurality of the openings OP may be formed through the second insulation layer 280. As such, when the touch display panel is bent, damage to the second insulation layer 280 may be minimized.

FIGS. 6A to 6I are cross-sectional views illustrating a method of manufacturing the touch display panel of FIG. 2.

Figure 6A:
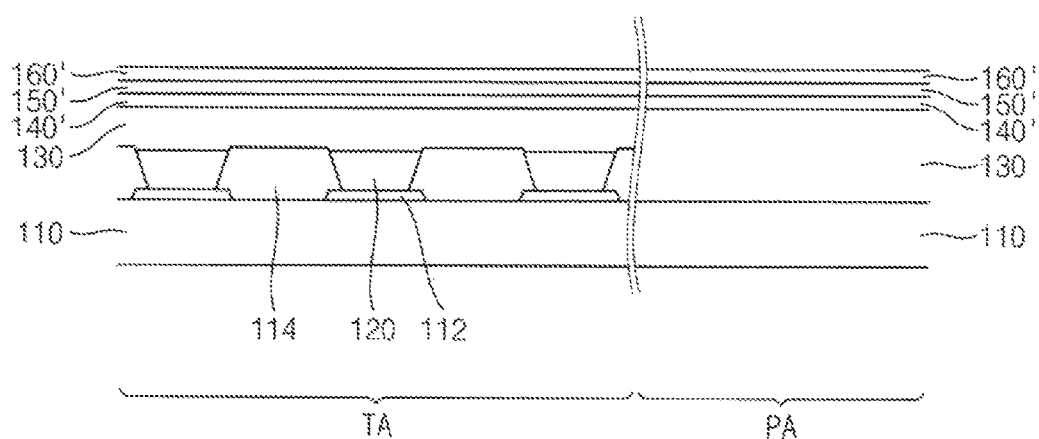
FIG. 6A, FIG. 6B, FIG. 6C, FIG. 6D, FIG. 6E, FIG. 6F, FIG. 6G, FIG. 6H, FIG. 6I, FIG. 6J, FIG. 6K, and FIG. 6L are cross-sectional views illustrating a method of manufacturing the touch display panel of FIG. 2.

Referring to FIG. 6A, a pixel electrode 112, a pixel defining layer 114, and a thin film encapsulation layer 130 may be formed on a thin-film transistor substrate 110. The thin-film transistor substrate 110, the pixel electrode 112, the pixel defining layer 114, and the thin film encapsulation layer 130 may be formed by various methods known in the art.

The touch display panel 100 may include a touch area TA that may detect a touch position, and a peripheral area PA which is adjacent to the touch area TA and disposed at an edge of the touch display panel 100.

A buffer layer 140' may be formed on the thin film encapsulation layer 130. The buffer layer 140' may include an inorganic insulation material. The buffer layer 140' may be formed by a spin coating process, a chemical vapor deposition (CVD) process, a plasma enhanced chemical vapor deposition (PECVD) process, a high density plasma-chemical vapor deposition (HDP-CVD) process, a printing process, and etc.

A first metal layer 150' may be formed on the buffer layer 140'. The first metal layer 150' may include metal such as gold (Au), silver (Ag), copper (Cu), nickel (Ni), iron (Fe), cobalt (Co), zinc (Zn), chromium (Cr), manganese (Mn), or combinations thereof. The first metal layer 150' may be formed by a printing process, a sputtering process, a CVD process, a pulsed laser deposition (PLD) process, a vacuum evaporation process, an atomic layer deposition (ALD) process, and etc.

A first insulation layer 160' may be formed on the first metal layer 150'. The first insulation layer 160' may include an inorganic insulation material. The first insulation layer 160' may be formed by a spin coating process, a CVD process, a PECVD process, a HDP-CVD process, a printing process, and etc.

Figure 6B:
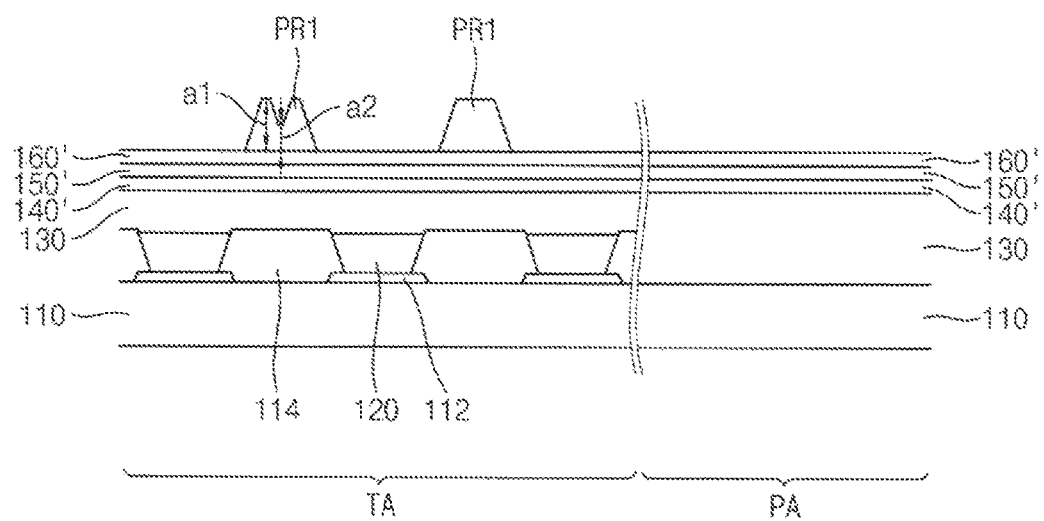

Referring to FIG. 6B, a first photoresist pattern PR1 may be formed on the first insulation layer 160'. The first photoresist pattern PR1 may include a first portion having a first height a1 and a second portion having a second height a2.

The first height a1 may be greater than the second height a2. The first photoresist pattern PR1 may be formed using a half tone mask and the like. For example, a photoresist layer may be formed on the first insulation layer 160', and then the first photoresist pattern PR1 may be formed by exposing the photoresist layer with the halftone mask and developing the photoresist layer.

Figure 6C:
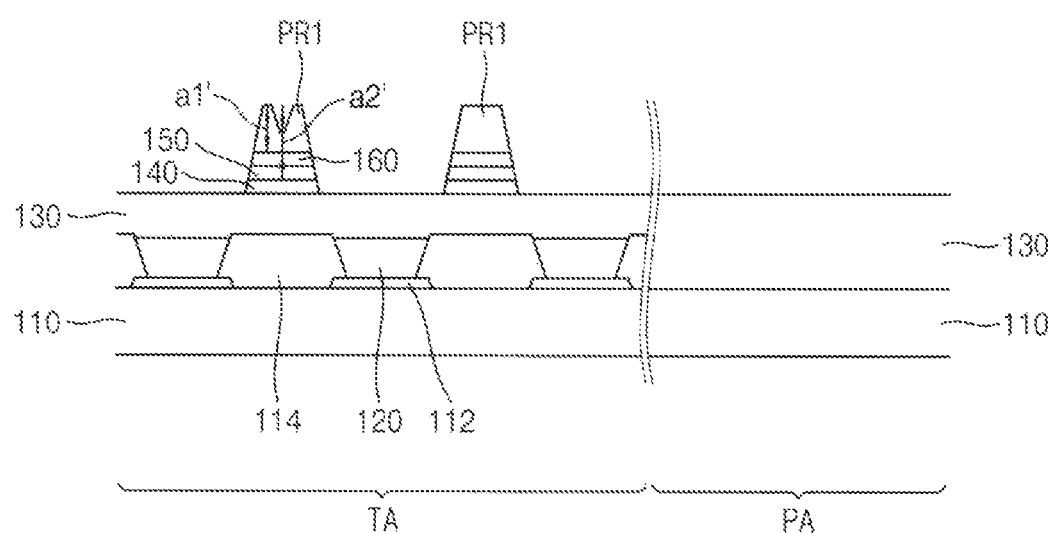

Referring to FIG. 6C, a buffer pattern 140, a first metal pattern 150, and a first insulation pattern 160 may be formed by patterning the buffer layer 140', the first metal layer 150', and the first insulation layer 160'. The buffer pattern 140, the first metal pattern 150, and the first insulation pattern 160 may be formed by pattering the buffer layer 140', the first metal layer 150', and the first insulation layer 160' using the first photoresist pattern PR1 as a mask. For example, using the first photoresist pattern PR1 as an etch barrier, the buffer layer 140', the first metal layer 150', and the first insulation layer 160' may be dry or wet etched.

Figure 6D:
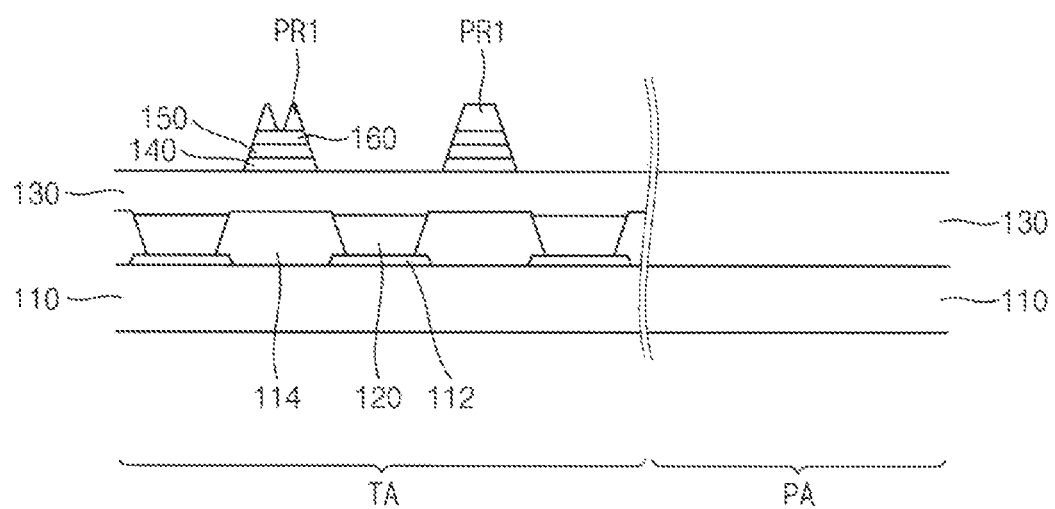

Referring to FIG. 6D, the second portion of the first photoresist pattern PR1 may be removed. For example, the second portion of the first photoresist pattern PR1 may be removed by removing the overall portions of the first photoresist pattern PR1 using ashing process and the like. Accordingly, the first photoresist pattern PR1 may expose a portion of the first insulation pattern 160.

Figure 6E:
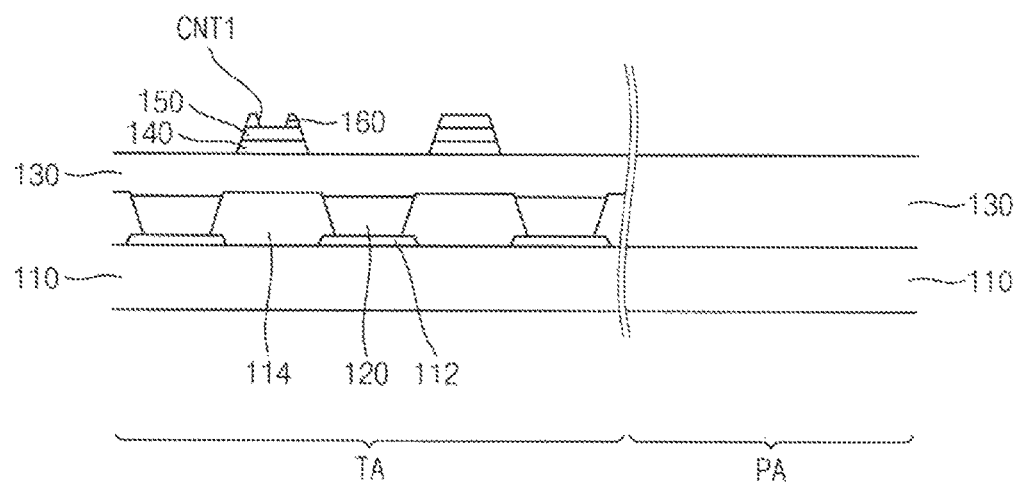

Referring to FIG. 6E, a first contact hole CNT1 may be formed through the first insulation pattern 160. Using the first photoresist pattern PR1 as a mask, the exposed portion of the first insulation pattern 160 may be removed. For example, the first insulation pattern 160 may be etched using the first photoresist pattern PR1 as an etch barrier, so that the first contact hole CNT1 may be formed. And then, the first photoresist pattern PR1 may be removed. For example, remaining of the first photoresist pattern PR1 may be removed by stripping process and the like.

Figure 6F:
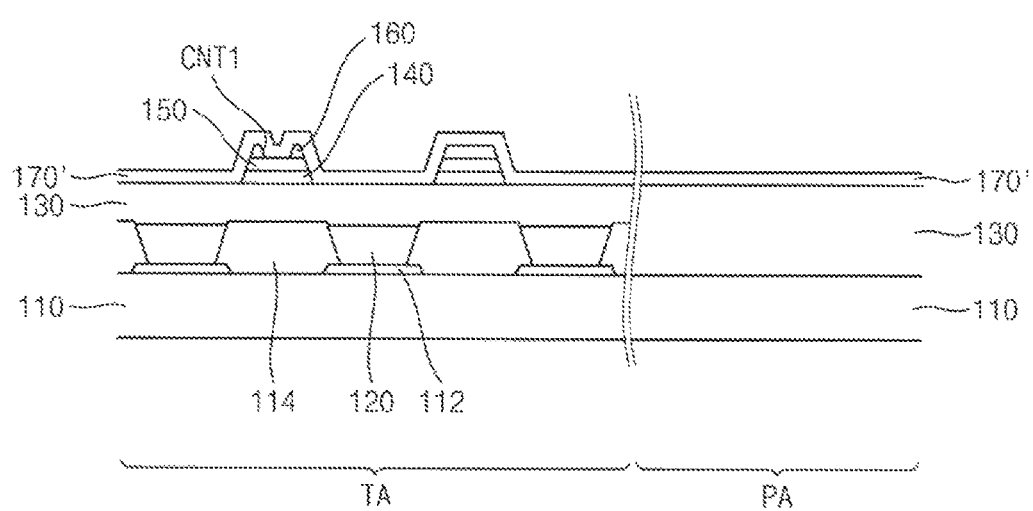

Referring to FIG. 6F, a second metal layer 170' may be formed on the thin film encapsulation layer 130 and the first insulation pattern 160 formed with the first contact hole CNT1. The second metal layer 170' may include metal such as gold (Au), silver (Ag), copper (Cu), nickel (Ni), iron (Fe), cobalt (Co), zinc (Zn), chromium (Cr), manganese (Mn), or combinations thereof. The second metal layer 170' may be formed by a printing process, a sputtering process, a CVD process, a pulsed laser deposition (PLD) process, a vacuum evaporation process, an atomic layer deposition (ALD) process, and etc.

Figure 6G:
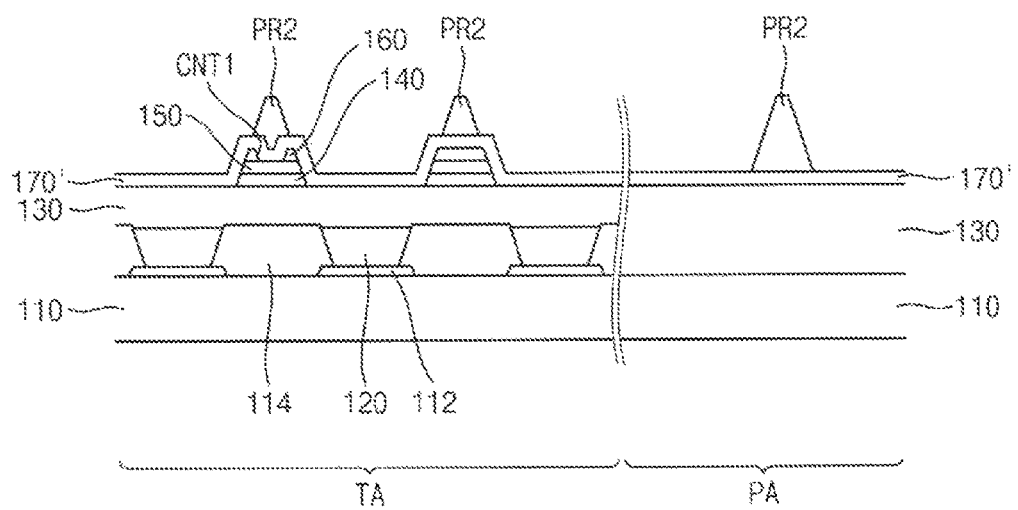

Referring to FIG. 6G, a second photoresist pattern PR2 may be formed on the second metal layer 170'. For example, a photoresist layer may be formed on the second metal layer 170', and then the second photoresist pattern PR2 may be formed by exposing the photoresist layer using a mask and developing the photoresist layer.

Figure 6H:
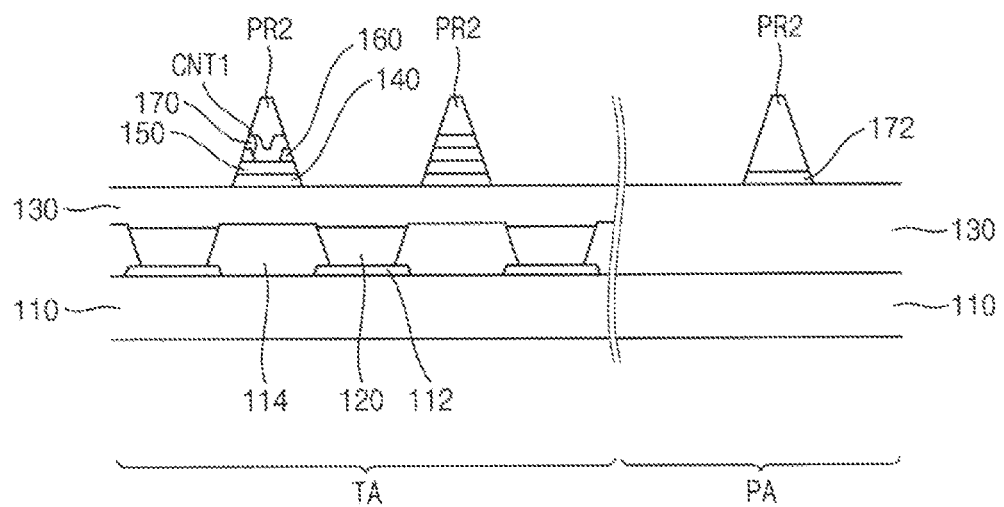

Referring to FIG. 6H, a second metal pattern 170 and a contacting pad 172 may be formed by patterning the second metal layer 170'. The second metal pattern 170 and the contacting pad 172 may be formed by pattering the second metal layer 170' using the second photoresist pattern PR2 as a mask. For example, using the second photoresist pattern PR2 as an etch barrier, the second metal layer 170' may be dry or wet etched.

Figure 6I:
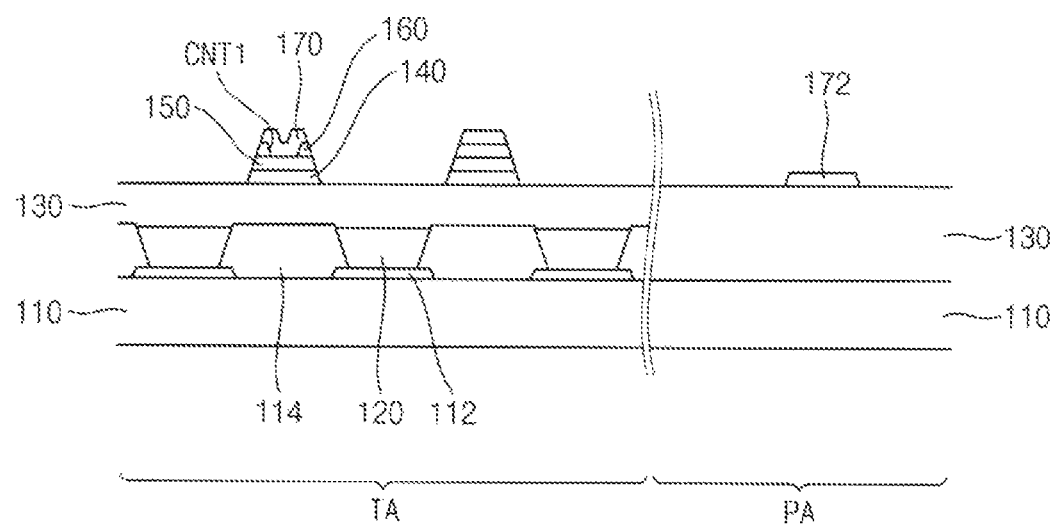

Referring to FIG. 6I, the second photoresist pattern PR2 may be removed. For example, remaining of the second photoresist pattern PR2 may be removed by stripping process and the like.

Figure 6J:
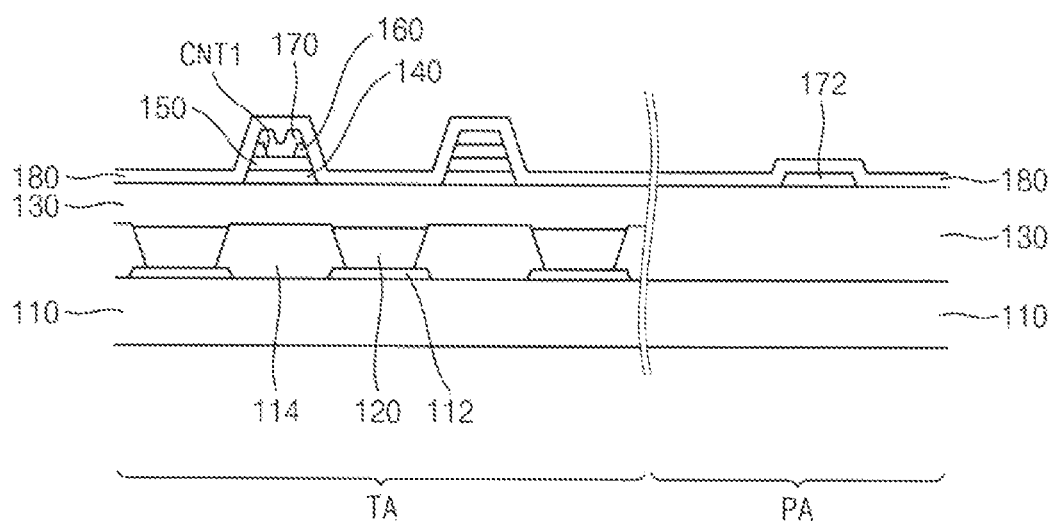

Referring to FIG. 6J, a second insulation layer 180 may be formed on the thin film encapsulation layer 130 on which the second metal pattern 170 and the contacting pad 172 are formed. The second insulation layer 180 may include an inorganic insulation material. The second insulation layer 180 may be formed by a spin coating process, a CVD process, a PECVD process, a HDP-CVD process, a printing process, and etc.

Figure 6K:
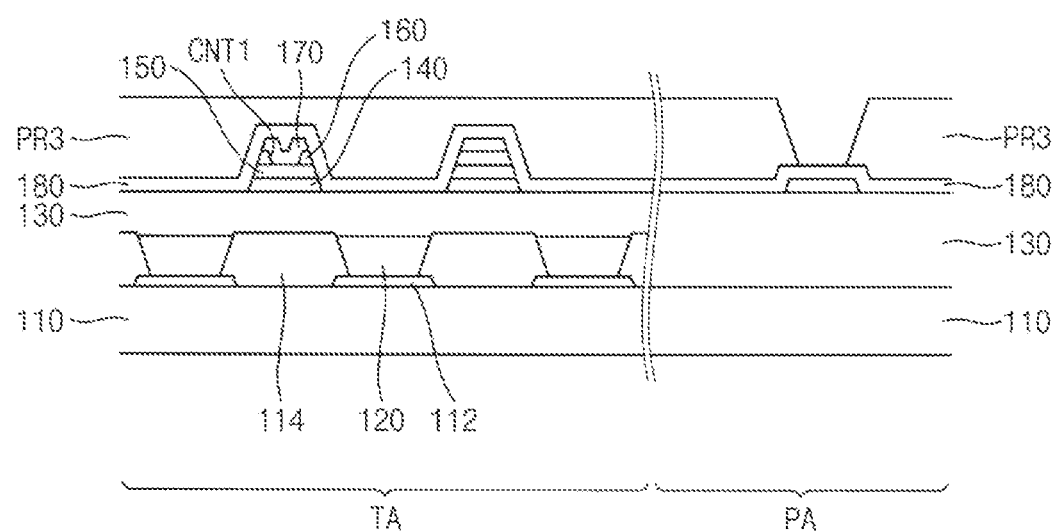

Referring to FIG. 6K, a third photoresist pattern PR3 may be formed on the second insulation layer 180. The third photoresist pattern PR3 may expose a portion of the second insulation layer 180. For example, a photoresist layer may be formed on the second insulation layer 180, and then the third photoresist pattern PR3 may be formed by exposing the photoresist layer using a mask and developing the photoresist layer.

Figure 6L:
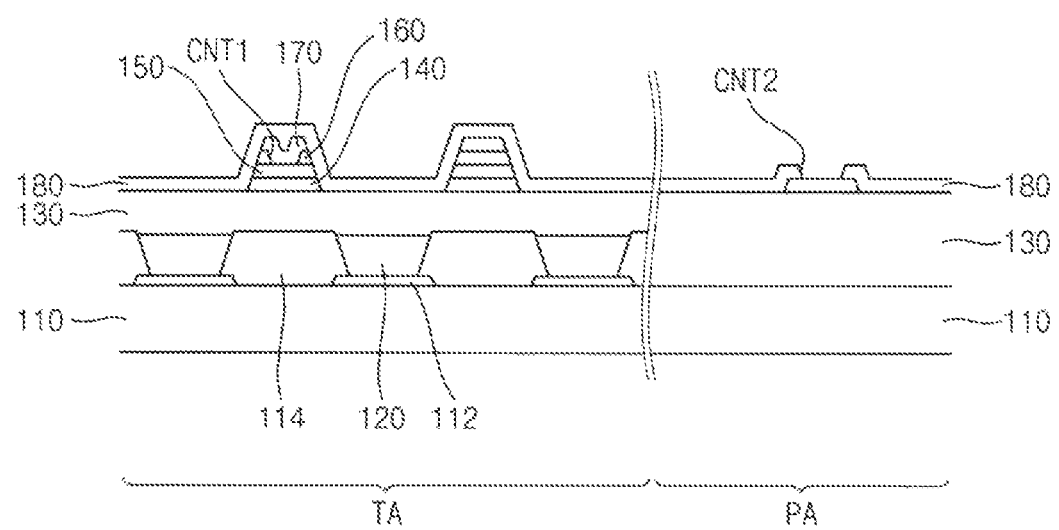

Referring to FIG. 6L, a second contact hole CNT2 exposing the contacting pad 172 may be formed through the second insulation layer 180. Using the third photoresist pattern PR3 as a mask, the exposed portion of the second insulation layer 180 may be removed. For example, the second insulation layer 180 may be etched using the third photoresist pattern PR3 as an etch barrier, so that the second contact hole CNT2 may be formed. And then, the third photoresist pattern PR3 may be removed. For example, remaining of the third photoresist pattern PR3 may be removed by stripping process and the like.

FIGS. 7A to 7H are cross-sectional views illustrating a method of manufacturing the touch display panel of FIG. 3.

Figure 7A:
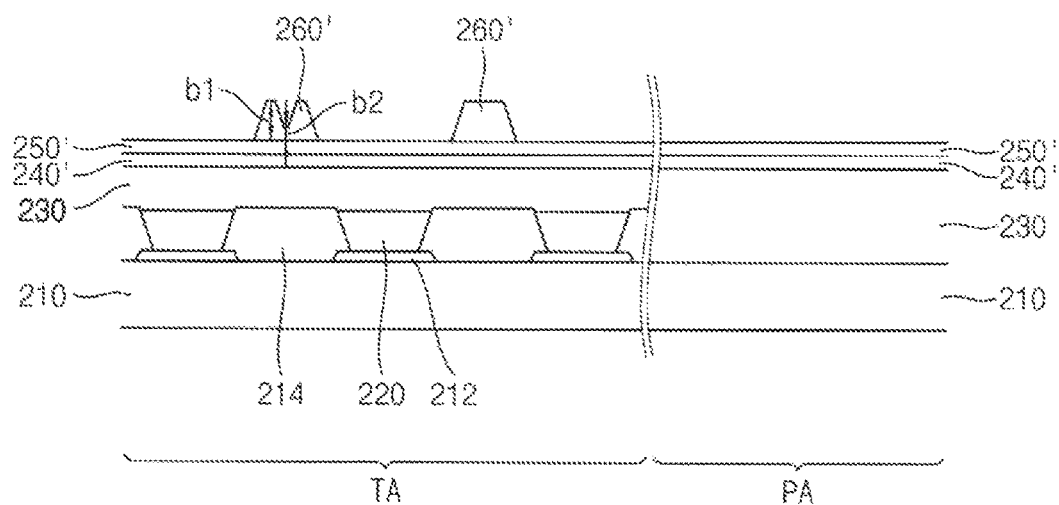
FIG. 7A, FIG. 7B, FIG. 7C, FIG. 7D, FIG. 7E, FIG. 7F, FIG. 7G, and FIG. 7H are cross-sectional views illustrating a method of manufacturing the touch display panel of FIG. 3.

Referring to FIG. 7A, a pixel electrode 212, a pixel defining layer 214, and a thin film encapsulation layer 230 may be formed on a thin-film transistor substrate 210. The thin-film transistor substrate 210, the pixel electrode 212, the pixel defining layer 214, and the thin film encapsulation layer 230 may be formed by various methods known in the art.

The touch display panel may include a touch area TA that may detect a touch position, and a peripheral area PA adjacent to the touch area TA and disposed at an edge of the touch display panel.

A buffer layer 240' may be formed on the thin film encapsulation layer 230. The buffer layer 240' may include an inorganic insulation material. A first metal layer 250' may be formed on the buffer layer 240'. The first metal layer 250' may include metal such as gold (Au), silver (Ag), copper (Cu), nickel (Ni), iron (Fe), cobalt (Co), zinc (Zn), chromium (Cr), manganese (Mn), or combinations thereof.

A first preliminary insulation pattern 260' may be formed on the first metal layer 250'. The first preliminary insulation pattern 260' may include an organic insulation material. For example the first insulation pattern 260' may include photoresist, acryl-based resin, polyimide-based resin, polyamide-based resin, siloxane-based resin, and etc. These may be used alone or in a combination thereof.

The first preliminary insulation pattern 260' may include a first portion having a first height b1 and a second portion having a second height b2. The first height b1 may be greater than the second height b2. The first preliminary insulation pattern 260' may be formed using a half tone mask and the like. For example, a photoresist layer may be formed on the first metal layer 250', and then the first preliminary insulation pattern 260' may be formed by exposing the photoresist layer using the halftone mask and developing the photoresist layer.

Figure 7B:
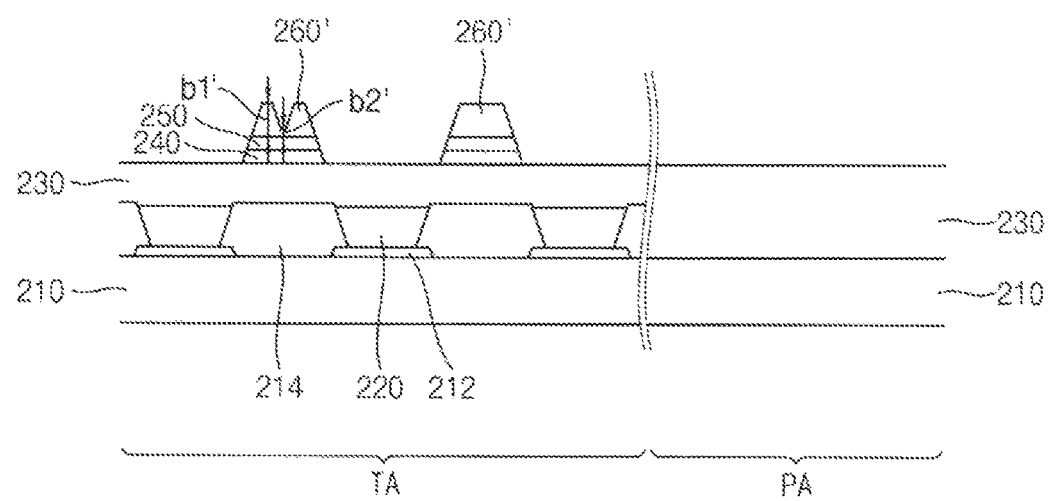

Referring to FIG. 7B, a buffer pattern 240 and a first metal pattern 250 may be formed by patterning the buffer layer 240' and the first metal layer 250'. The buffer pattern 240 and the first metal pattern 250 may be formed by pattering the buffer layer 240' and the first metal layer 250' by using the first preliminary insulation pattern 260' as a mask. For example, using the first preliminary insulation pattern 260' as an etch barrier, the buffer layer 240' and the first metal layer 250' may be dry or wet etched.

Figure 7C:
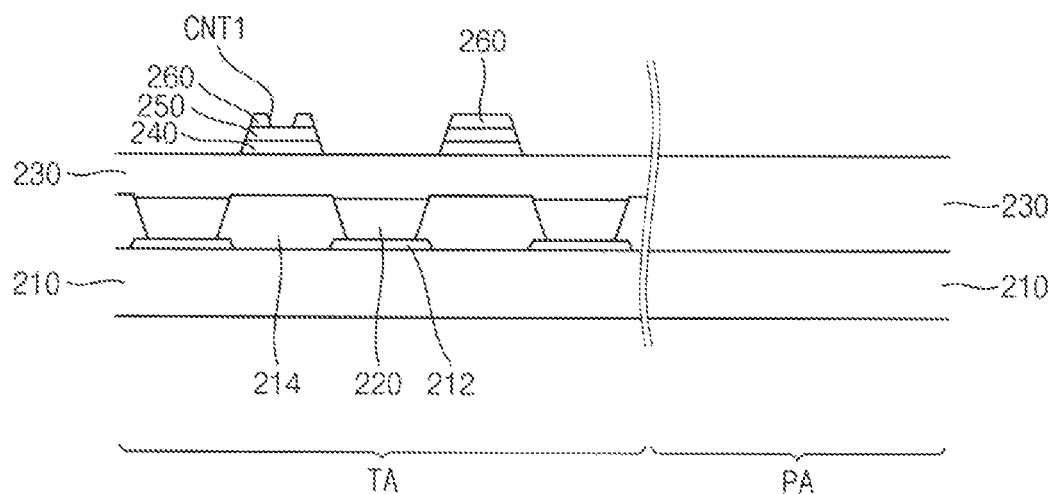

Referring to FIG. 7C, a first contact hole CNT1 may be formed by removing the second portion of the first preliminary insulation pattern 260'. Accordingly, a first insulation pattern 260 having the first contact hole CNT1 may be formed. For example, the second portion of the first preliminary insulation pattern 260' may be removed by removing the overall portions of the first preliminary insulation pattern 260' using ashing process and the like. Accordingly, the first contact hole CNT1 exposing a portion of the first metal pattern 250 may be formed.

Figure 7D:
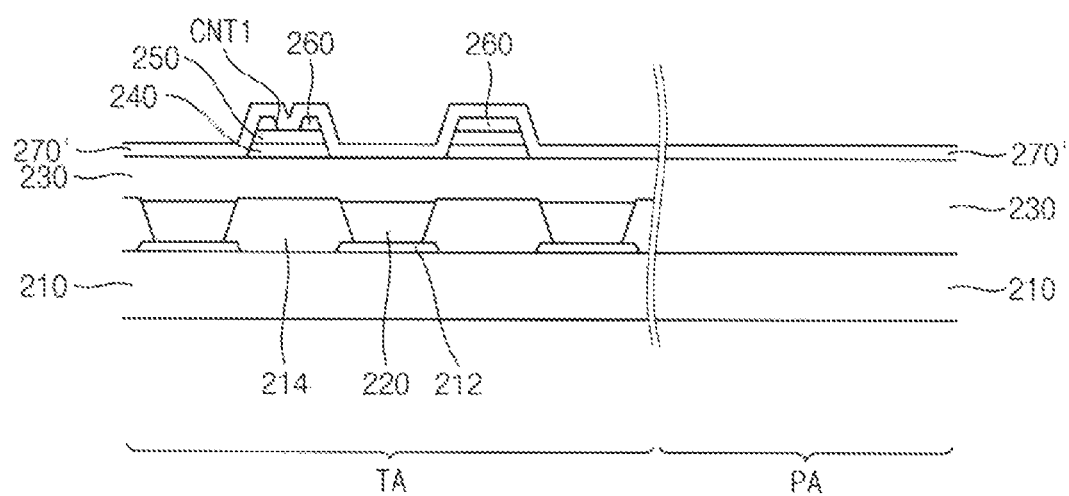

Referring to FIG. 7D, a second metal layer 270' may be formed on the first insulation pattern 260 having the first contact hole CNT1 and the thin film encapsulation layer 230.

Figure 7E:
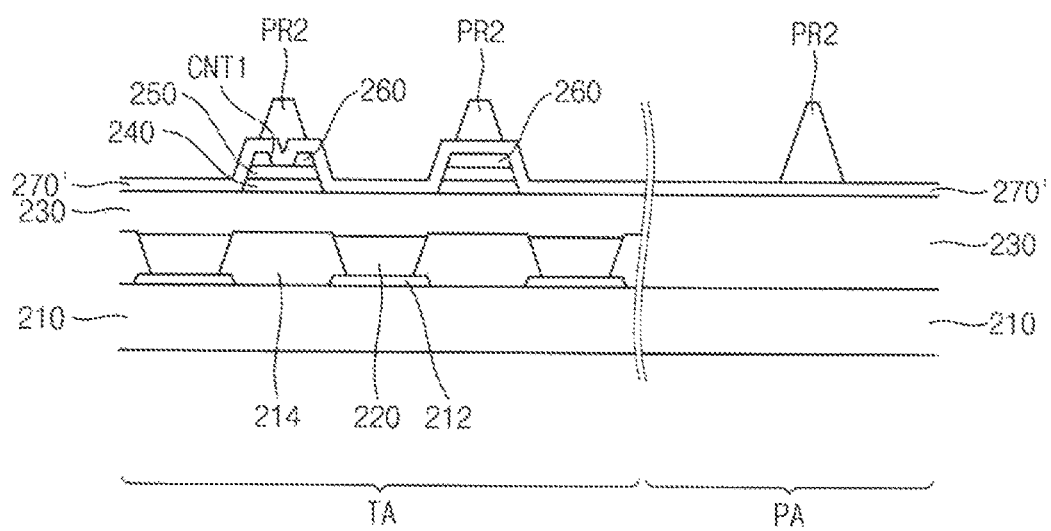

Referring to FIG. 7E, a second photoresist pattern PR2 may be formed on the second metal layer 270'.

Figure 7F:
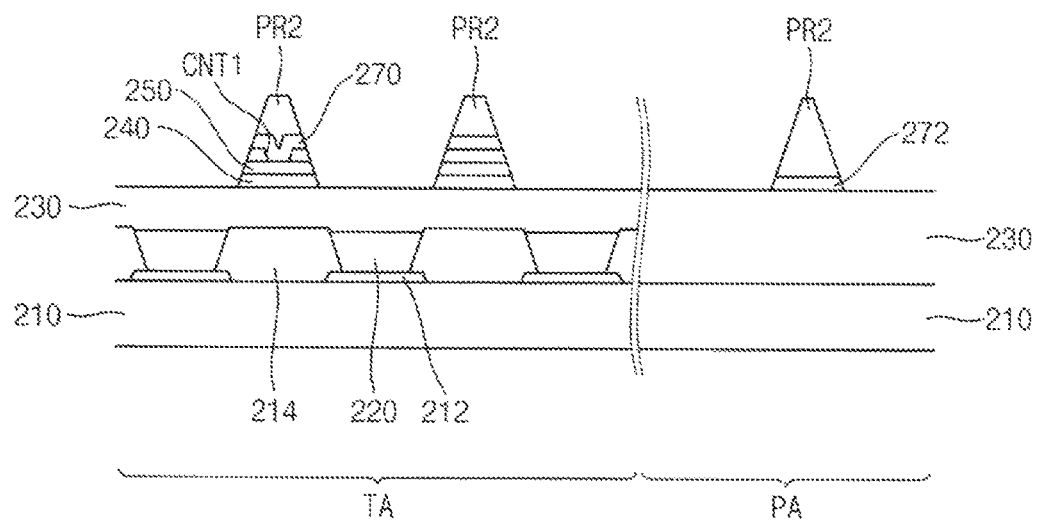

Referring to FIG. 7F, a second metal pattern 270 and a contacting pad 272 may be formed by patterning the second metal layer 270'. The second metal pattern 270 and the contacting pad 272 may be formed by pattering the second metal layer 270' using the second photoresist pattern PR2 as a mask.

Figure 7G:
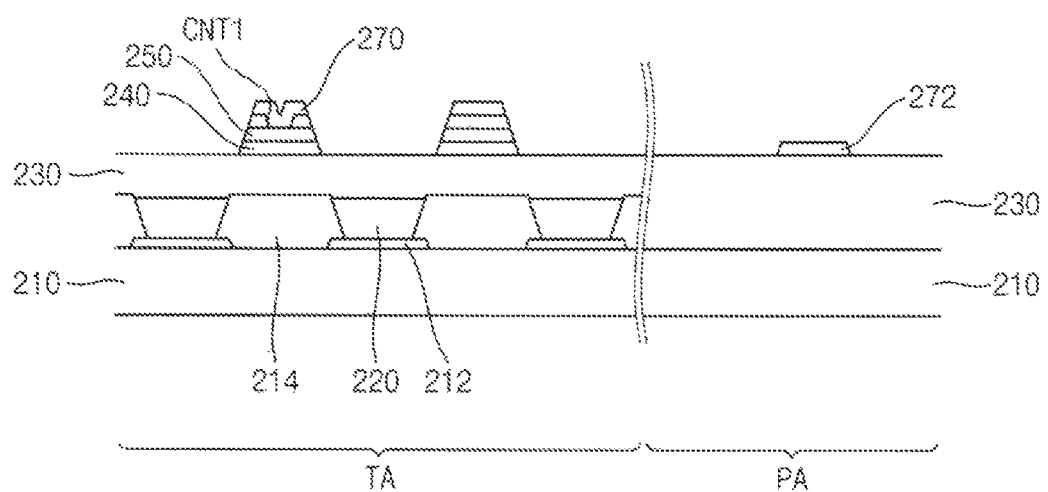

Referring to FIG. 7G, remaining portions of the second photoresist pattern PR2 may be removed.

Figure 7H:
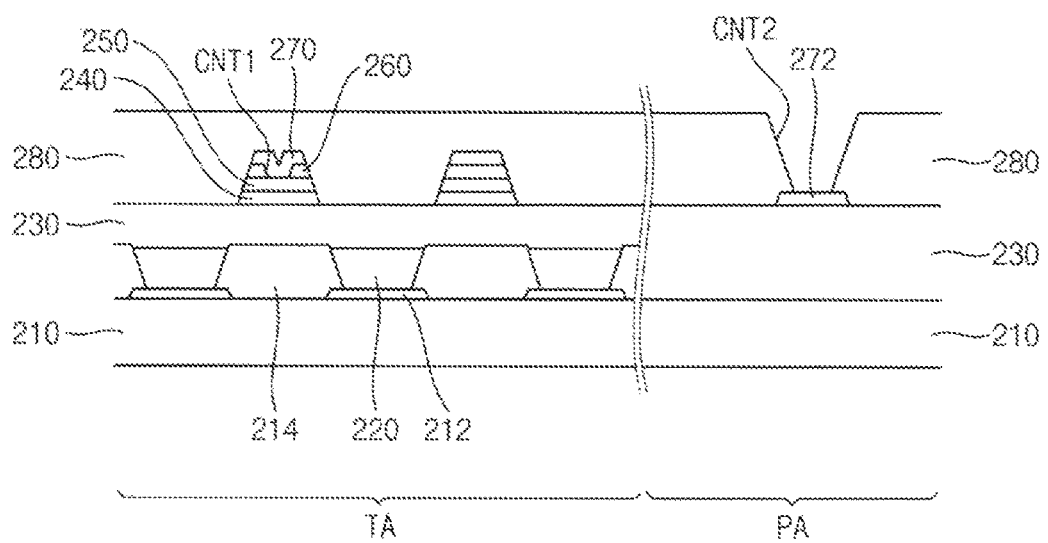

Referring to FIG. 7H, a second insulation layer 280 may be formed on the thin film encapsulation layer 230 on which the second metal pattern 270 and the contacting pad 272 are formed. The second insulation layer 280 may have a second contact hole CNT2 which exposes the contacting pad 272. The second insulation layer 280 may include an inorganic insulation material. For example, a photoresist layer may be formed on the second metal pattern 270, the contacting pad 272, and the thin film encapsulation layer 230, and then the second insulation layer 280 may be formed by exposing the photoresist layer by using a mask and developing the photoresist layer. Thus, second insulation layer 280 having the second contact hole CNT2 may be formed.

Figure 8A:
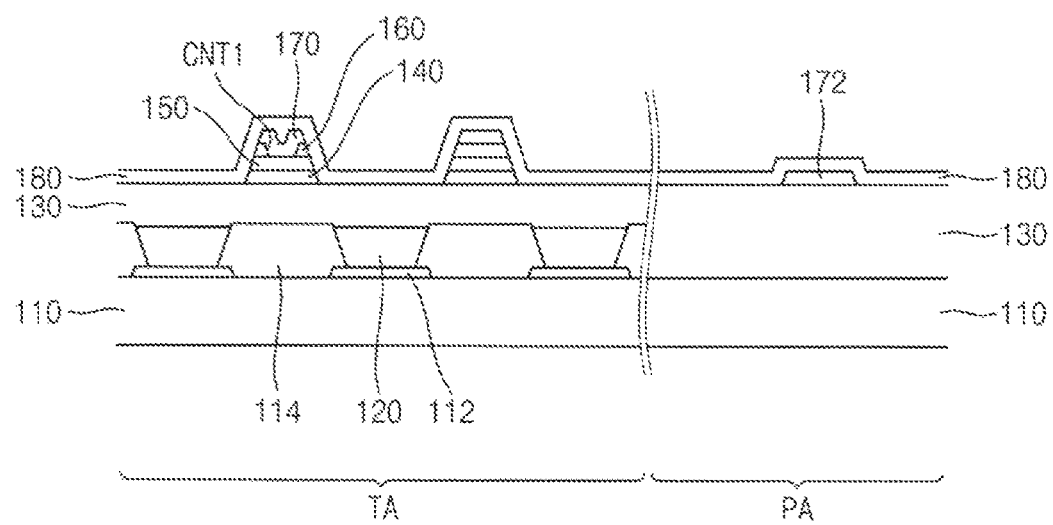
FIG. 8A, FIG. 8B, and FIG. 8C are cross-sectional views illustrating a method of manufacturing the touch display panel of FIG. 4.
Figure 8B:
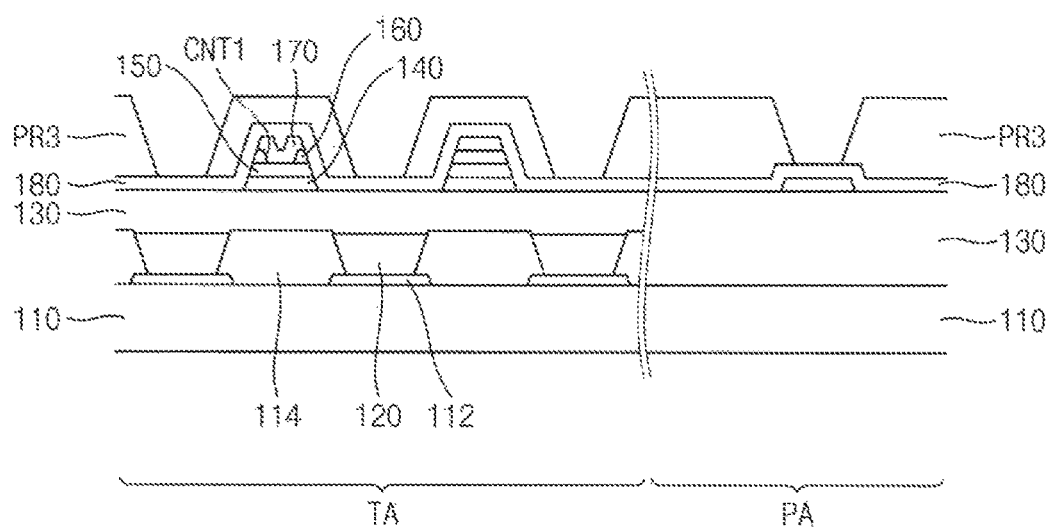
Figure 8C:
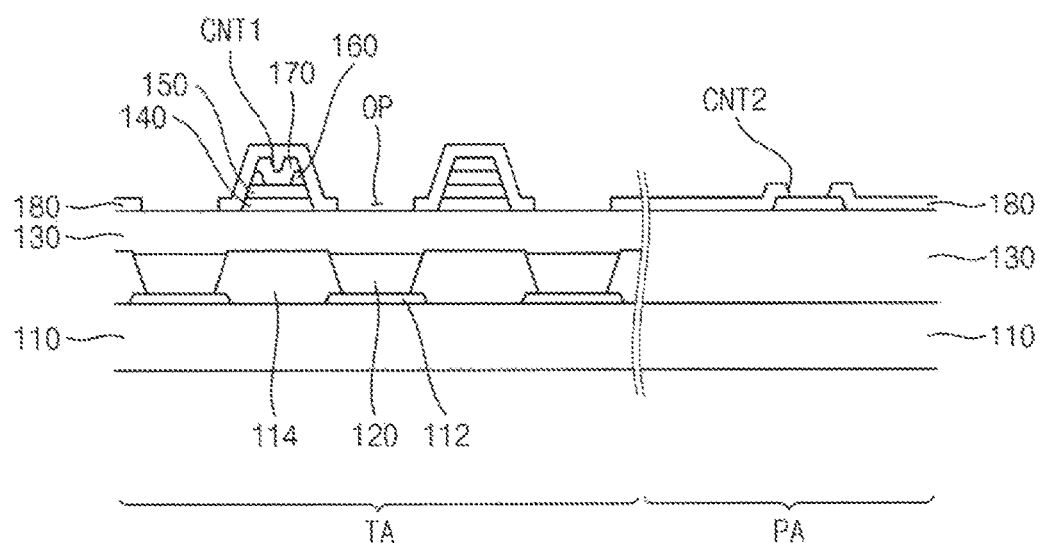

FIGS. 8A to 8C are cross-sectional views illustrating a method of manufacturing the touch display panel of FIG. 4.

Referring to FIG. 8A, the method of manufacturing the touch display panel is substantially the same as the method of manufacturing the touch display panel illustrated in FIGS. 6A to 6L, expect for forming an opening OP in a second insulation layer 180. Thus, detailed descriptions with respect to the substantially the same processes will be briefly explained or omitted.

A pixel electrode 112, a pixel defining layer 114, and a thin film encapsulation layer 130 may be formed on a thin-film transistor substrate 110. The thin-film transistor substrate 110, the pixel electrode 112, the pixel defining layer 114, and the thin film encapsulation layer 130 may be formed by various methods known in the art.

The touch display panel may include a touch area TA that may detect a touch position, and a peripheral area PA adjacent to the touch area TA and disposed at an edge of the touch display panel.

A buffer pattern 140, a first metal pattern 150, a first insulation pattern 160 having a first contact hole CNT1, a second metal pattern 170, and a contacting pad 172 may be formed on the thin film encapsulation layer 130. The second insulation layer 180 may include an inorganic insulation material.

Referring to FIG. 8B, a third photoresist pattern PR3 may be formed on the second insulation layer 180. The third photoresist pattern PR3 may expose a portion of the second insulation layer 180. For example, a photoresist layer may be formed on the second insulation layer 180, and then the third photoresist pattern PR3 may be formed by exposing the photoresist layer by using a mask and developing the photoresist layer.

Referring to FIG. 8C, a second contact hole CNT2 exposing the contacting pad 172 may be formed through the second insulation layer 180, and an opening OP that corresponds to the light emitting structure 120 may be formed through the second insulation layer 180. Using the third photoresist pattern PR3 as a mask, the exposed portion of the second insulation layer 180 may be removed. For example, the second insulation layer 180 may be etched using the third photoresist pattern PR3 as an etch barrier, so that the second contact hole CNT2 and the opening OP may be formed. And then, the third photoresist pattern PR3 may be removed. For example, remaining portions of the third photoresist pattern PR3 may be removed by stripping process and the like.

Figure 9A:
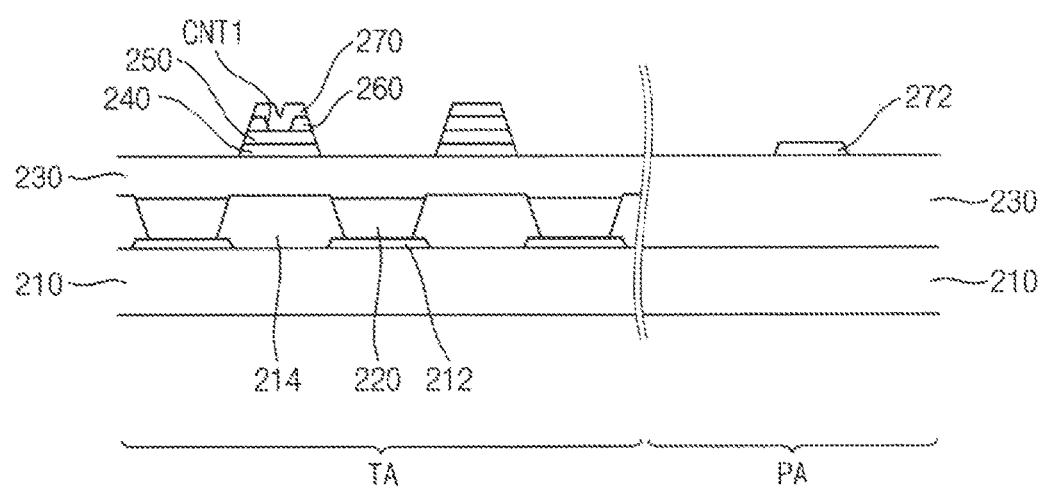
FIG. 9A and FIG. 9B are cross-sectional views illustrating a method of manufacturing the touch display panel of FIG. 5.
Figure 9B:
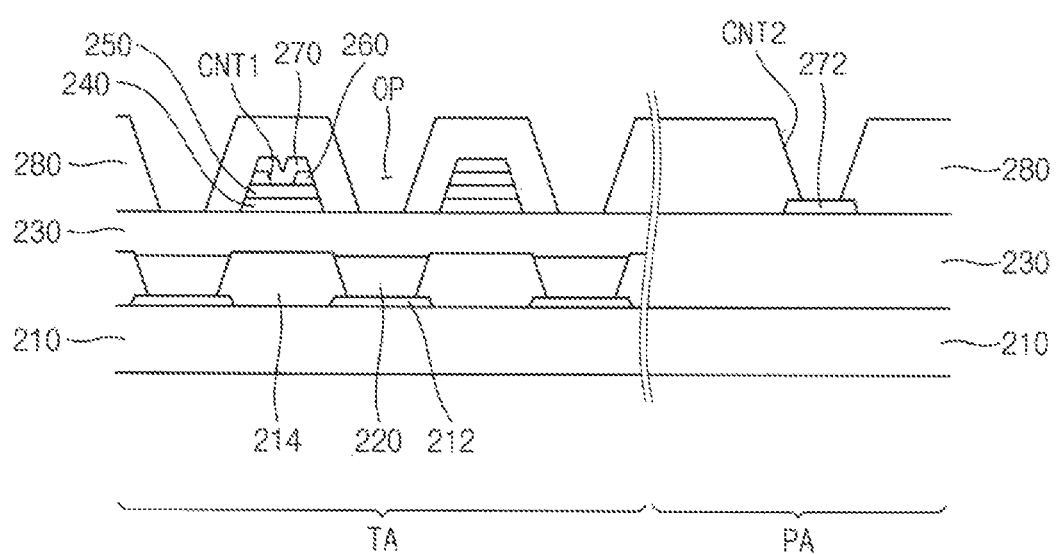

FIGS. 9A and 9B are cross-sectional views illustrating a method of manufacturing the touch display panel of FIG. 5.

Referring to FIG. 9A, the method of manufacturing the touch display panel is substantially same as the method of manufacturing the touch display panel illustrated in FIGS. 7A to 7H, expect for forming an opening OP in a second insulation layer 280. Thus, detailed descriptions with respect to the substantially the same processes will be briefly explained or omitted.

A pixel electrode 212, a pixel defining layer 214, and a thin film encapsulation layer 230 may be formed on a thin-film transistor substrate 210. The thin-film transistor substrate 210, the pixel electrode 212, the pixel defining layer 214, and the thin film encapsulation layer 230 may be formed by various methods known in the art.

The touch display panel may include a touch area TA that may detect a touch position, and a peripheral area PA adjacent to the touch area TA and disposed at an edge of the touch display panel.

A buffer pattern 240, a first metal pattern 250, a first insulation pattern 260 having a first contact hole CNT1, a second metal pattern 270, and a contacting pad 272 may be formed on the thin film encapsulation layer 230.

Referring to FIG. 9B, a second insulation layer 280 may be formed on the thin film encapsulation layer 230 on which the second metal pattern 270 and the contacting pad 272 are formed. The second insulation layer 280 may have a second contact hole CNT2 exposing the contacting pad 272, and an opening OP that corresponds to the light emitting structure 220. The second insulation layer 280 may include an organic insulation material. For example, a photoresist layer may be formed on the second metal pattern 270, the contacting pad 272, and the thin film encapsulation layer 230, and then the second insulation layer 280 having the second contact hole CNT2 and the opening OP may be formed by exposing the photoresist layer by using a mask and developing the photoresist layer.

According to exemplary embodiments, the buffer pattern, the first metal pattern, and the first insulation pattern of the touch display panel may be formed by using the same mask. Thus, the touch display panel has a simple structure as compared to that of a conventional touch display panel, and thus, manufacturing productivity may be improved.

In addition, the first insulation pattern may not overlap a pixel structure. As such, the thickness of the touch display panel corresponding to the pixel structure may be reduced, which may improve bendability of the touch display panel and the transmittance thereof.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A touch display panel, comprising:
a thin-film transistor substrate comprising a thin-film transistor;
a pixel defining layer disposed on the thin-film transistor substrate and comprising a first opening;
a light emitting structure disposed in the first opening;
a thin film encapsulation layer covering the light emitting structure and the pixel defining layer;
a first metal pattern disposed on the thin film encapsulation layer;
a first insulation pattern disposed on the first metal pattern and having substantially the same shape as the first metal pattern in a plan view;
a second metal pattern disposed on the first insulation pattern; and
a second insulation layer disposed on the second metal pattern and the thin film encapsulation layer, and contacting the first metal pattern, the first insulation pattern, and the second metal pattern.

2. The touch display panel of claim 1, wherein the first metal pattern overlaps the pixel defining layer.

3. The touch display panel of claim 2, wherein the second metal pattern overlaps the pixel defining layer.

4. The touch display panel of claim 1, wherein:
a first contact hole is formed through the first insulation pattern; and
the second metal pattern is electrically connected to the first metal pattern through the first contact hole.

5. The touch display panel of claim 1, wherein the second insulation layer comprises a second opening overlapping the light emitting structure.

6. The touch display panel of claim 1, wherein the first insulation pattern and the second insulation layer comprise an inorganic insulation material.

7. The touch display panel of claim 1, wherein the first insulation pattern and the second insulation layer comprise an organic insulation material.

8. A touch display panel, comprising:
a touch area and a peripheral area adjacent to the touch area; and
a contacting pad disposed in the peripheral area;
a thin-film transistor substrate comprising a thin-film transistor;
a pixel defining layer disposed on the thin-film transistor substrate and comprising a first opening;
a light emitting structure disposed in the first opening;
a thin film encapsulation layer covering the light emitting structure and the pixel defining layer;
a first metal pattern disposed on the thin film encapsulation layer;
a first insulation pattern disposed on the first metal pattern and having substantially the same shape as the first metal pattern in a plan view;
a second metal pattern disposed on the first insulation pattern; and
a second insulation layer disposed on the second metal pattern and the thin film encapsulation layer and covering the first metal pattern, the first insulation pattern, and the second metal pattern, wherein:
the second insulation layer comprises a second contact hole exposing a portion of the contacting pad; and
the first and second metal patterns are disposed in the touch area.

9. A touch display panel, comprising:
a thin-film transistor substrate comprising a thin-film transistor;
a pixel defining layer disposed on the thin-film transistor substrate and comprising a first opening;
a light emitting structure disposed in the first opening;
a thin film encapsulation layer covering the light emitting structure and the pixel defining layer;
a first metal pattern disposed on the thin film encapsulation layer;
a first insulation pattern disposed on the first metal pattern and having substantially the same shape as the first metal pattern in a plan view;
a second metal pattern disposed on the first insulation pattern; and
a second insulation layer disposed on the second metal pattern and the thin film encapsulation layer and covering the first metal pattern, the first insulation pattern, and the second metal pattern; and
a buffer pattern disposed on the thin film encapsulation layer,
wherein the first metal pattern is disposed on the buffer pattern and has the same shape as the buffer pattern in a plan view.

* * * * *